United States Patent
Kurd et al.

(10) Patent No.: US 7,042,259 B2
(45) Date of Patent: May 9, 2006

(54) ADAPTIVE FREQUENCY CLOCK GENERATION SYSTEM

(75) Inventors: Nasser A. Kurd, Portland, OR (US); Javed S. Barkatullah, Portland, OR (US); Paul Madland, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 10/813,551

(22) Filed: Mar. 31, 2004

(65) Prior Publication Data

US 2005/0218955 A1 Oct. 6, 2005

(51) Int. Cl.
*H03L 7/06* (2006.01)

(52) U.S. Cl. ..................... 327/147; 327/156

(58) Field of Classification Search ............ 327/146, 327/147, 154, 155, 156, 162, 163, 291; 331/17, 331/25, DIG. 2; 375/373, 375, 376
See application file for complete search history.

(56) References Cited

U.S. PATENT DOCUMENTS

| | | | | |
|---|---|---|---|---|
| 6,218,876 B1 * | 4/2001 | Sung et al. | ........... | 327/156 |
| 6,320,424 B1 | 11/2001 | Kurd et al. | ........... | 327/8 |
| 6,542,013 B1 | 4/2003 | Volk et al. | ........... | 327/115 |
| 6,570,456 B1 * | 5/2003 | Mano et al. | ........... | 331/11 |
| 6,621,314 B1 | 9/2003 | Krishnamurty | ........... | 327/158 |
| 6,816,019 B1 * | 11/2004 | Delbo' et al. | ........... | 331/17 |
| 2003/0137328 A1 | 7/2003 | Kurd et al. | ........... | 327/156 |

FOREIGN PATENT DOCUMENTS

JP 2003298417 A * 10/2003

* cited by examiner

*Primary Examiner*—Linh My Nguyen
(74) *Attorney, Agent, or Firm*—Fleshner & Kim, LLP

(57) ABSTRACT

A clock generating apparatus is provided that includes a first phase lock loop device powered by an analog (or fixed) power supply voltage and a second phase lock loop device powered by the analog power supply voltage and a digital power supply voltage. The second phase lock loop device to output a clock signal having an adaptive frequency based on the digital power supply voltage.

30 Claims, 10 Drawing Sheets

ADAPTIVE FREQUENCY CLOCK GENERATION SYSTEM

FIELD

Embodiments of the present invention may relate to phase-lock loop circuits. More particularly, embodiments of the present invention may relate to adaptive phase-lock loop circuits and/or systems.

BACKGROUND

Phase-lock loop (PLL) circuits have generally been provided in order to provide a fixed frequency clock signal that is provided to a core of an integrated circuit, for example. That is, a PLL may synthesize a high frequency core clock signal from a low reference clock signal. The PLL may be powered from an analog power supply (VCCA) or from a filtered power supply in order to ensure a constant clock frequency even in the event of voltage droops. Voltage droop may occur when a level of activity changes, such as changes from a high activity level to a low activity level or from a low activity level to a high activity level. The change of activity level may cause a current surge to occur, which may in turn, cause the voltage to droop. These voltage droops may be factored into component design such that the components operate during voltage droops. As voltages scale down and droop percentages increase, additional timing margins may be required to be able to function at the target frequencies, such as the target frequency of the core.

BRIEF DESCRIPTION OF THE DRAWINGS

The foregoing and a better understanding of the present invention will become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
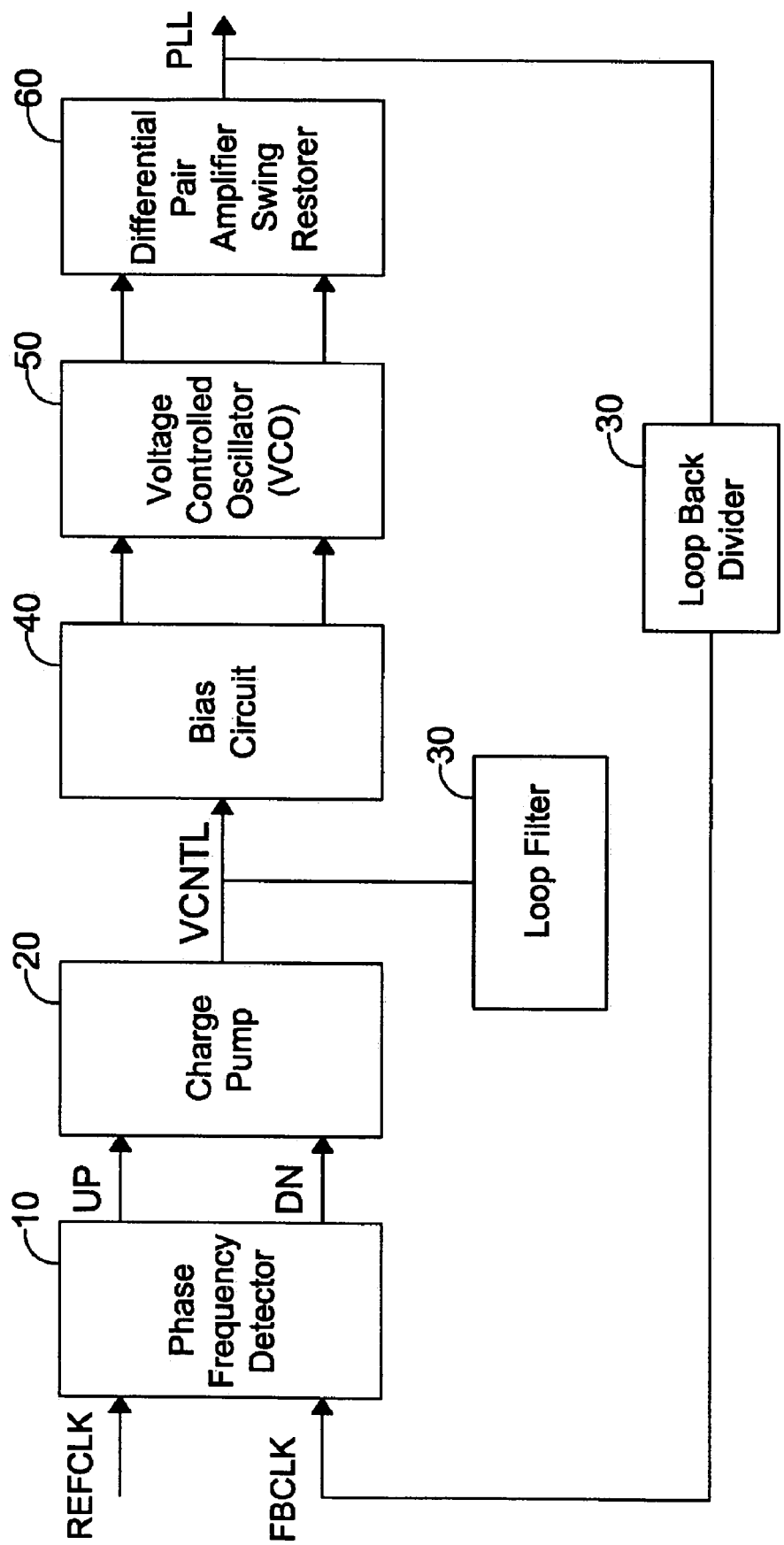
FIG. 1 shows a PLL system according to an example arrangement.

In the following detailed description, like reference numerals and characters may be used to designate identical, corresponding or similar components in differing figure drawings. Further, in the detailed description to follow, example sizes/models/values/ranges may be given although embodiments of the present invention are not limited to the same. Well-known power/ground connections to integrated circuits (ICs) and other components may not be shown within the FIGs. for simplicity of illustration and discussion. Further, arrangements and embodiments may be shown in block diagram form in order to avoid obscuring the invention, and also in view of the fact that specifics with respect to implementation of such block diagram arrangements may be dependent upon the platform within which the present invention is to be implemented. That is, the specifics may be well within the purview of one skilled in the art. Where specific details are set forth in order to describe example embodiments of the invention, it should be apparent to one skilled in the art that embodiments of the present invention can be practiced without these specific details.

In the following disclosure, the terminologies voltage, voltage source and power source may be used interchangeably in view of symbols used in the various figures. Most particularly, VCCA may be shown in the figures and described in the disclosure with respect to an analog voltage (or voltage signal) and VCCD may be shown in the figures and described in the disclosure with respect to a digital voltage (or voltage signal). The VCCA may be considered a "clean" voltage and the VCCD may be considered a "noisy" voltage.

FIG. 1 shows a PLL system according to an example arrangement. Other arrangements are also possible. More specifically, FIG. 1 shows a PLL system that includes a phase frequency detector 10, a charge pump 20, a loop filter 30, a bias circuit 40, a voltage controlled oscillator (VCO) 50 and a differential pair amplifier restorer 60 and loop back divider 70 that are interconnected to form a feedback PLL system.

In operation, the phase frequency detector 10 receives an input (or external clock) signal (REFCLK) and a feedback signal (FBCLK). As shown in FIG. 1, the FBCLK signal is the output signal (PLLOUT) output from the voltage controlled oscillator (VCO) 50, the signal having passed through the differential pair amplifier restorer 60 and loop back divider 70. The phase frequency detector 10 compares the REFCLK signal and the FBCLK signal to determine if there is any phase difference between the REFCLK signal and the FBCLK signal. If the phase frequency detector 10 detects a phase difference, the phase frequency detector 10 generates one of an up (UP) signal or a down (DN) signal in order to pump a control voltage (VCNTL) higher or lower. For example, if the REFCLK signal leads the FBCLK signal, then the phase frequency detector 10 would activate the UP signal a specific amount corresponding to the phase difference. Alternately, if the FBCLK signal leads the REFCLK signal, then the phase frequency detector 10 would activate the DN signal a specific amount corresponding to the phase difference. If the REFCLK signal and the FBCLK signal are in-phase, then both the UP signal and the DN signal are activated for a small time simultaneously such that the control voltage does not change.

Activated by the phase frequency detector 10, the UP signal or the DN signal charges and discharges the capacitor voltage of the loop filter 30. The charged/discharged capacitor voltage of the loop filter 30 is applied to the bias circuit 40, which generates the NBIAS signal and PBIAS signal that control the frequency of the voltage controlled oscillator (VCO) 50. That is, the charge pump 20 converts the digital state (UP/DN) of the phase frequency detector 10 into an analog control voltage (VCNTL) which is used to operate and control the voltage controlled oscillator (VCO) 50. The control voltage signal (VCNTL) is then applied to the voltage controlled oscillator (VCO) 50 which varies the set frequency of the voltage controlled oscillator (VCO) 50 in a direction which reduces the frequency difference or phase error between the input signal (REFCLK) and the feedback signal (FBCLK).

The voltage controlled oscillator (VCO) 50 may output two differential signals. These signals are then supplied to the differential pair amplifier restorer 60, which converts the differential analog swing to a single-ended digital swing.

The signal output from the differential pair amplifier restorer 60 is then input to the loop back divider 70 where it is further divided by a ratio (N), and then fed back to the PLL 10. The ratio (N) determines the frequency of the signal generated by the PLL 10. The process is repeated until the REFCLK and FBCLK signals become synchronized and a locked state is achieved.

PLLs have been provided to provide fixed frequency clock signals. In view of voltage droops (among other events), the core of an integrated circuit may therefore be designed in a fixed frequency system based on a lowest expected voltage that the core may anticipate (to guarantee the components will function). Embodiments of the present invention may provide an adaptive clocking system that allows the frequency clock signal to change (as compared to having a nominal frequency) based on voltage changes. Stated differently, the frequency may track the supply voltage. This may avoid or lessen the need to design the core based on the lowest expected voltage. This may result in power and performance benefits.

Figure 2:
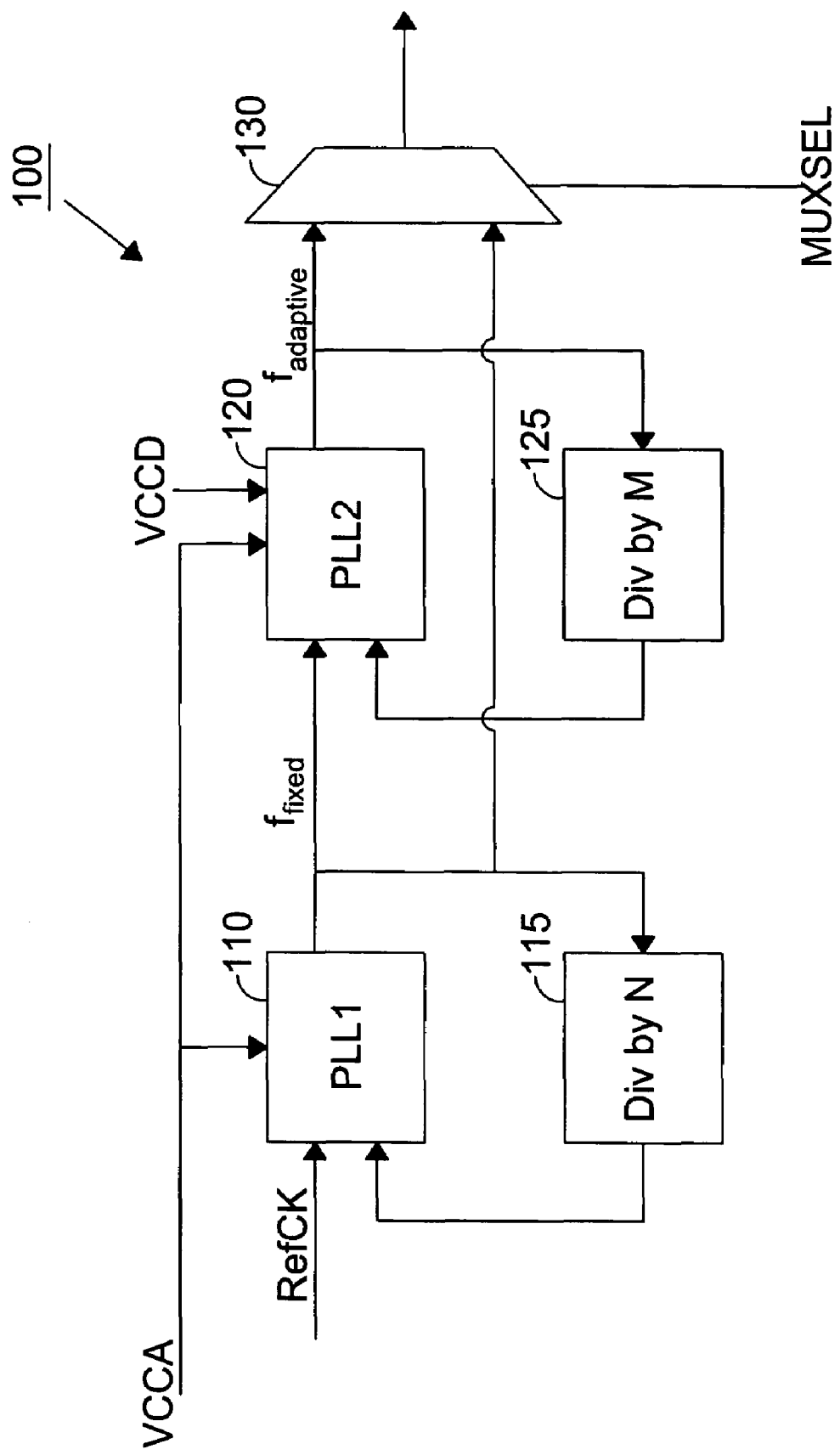
FIG. 2 shows an adaptive clocking system according to an example embodiment of the present invention.

FIG. 2 shows an adaptive clocking system 100 according to an example embodiment of the present invention. Other embodiments and configurations are also within the scope of the present invention. More specifically, FIG. 2 shows a first PLL (PLL1) 110 and a second PLL (PLL2) 120 to produce an adaptive frequency clock signal $f_{adaptive}$ based on two different voltages VCCA and VCCD. This may differ from other PLLs that power components using only one power supply source (or one power supply voltage). The different voltages used to power the PLLs may be provided from different power sources such as an analog source (i.e., a "clean" source) and a digital source (i.e., a "noisy" source). The PLL1 110 may be associated with a divide-by-N circuit 115 and the PLL2 120 may be associated with a divide-by-M circuit 125. The PLL1 110 may be called a fixed frequency PLL since it outputs a fixed frequency signal whereas the PLL2 may be called an adaptive (frequency) PLL since it outputs an adaptive (or changing) frequency signal.

The PLL1 110 multiplies a frequency of an input reference clock signal (RefCK) by a ratio N, determined from the divide-by-N circuit 115, to generate a fixed frequency signal ($f_{fixed}$). The PLL1 110 may thereby provide an optimal reference frequency signal ($f_{fixed}$) for the PLL2 120. The PLL1 110 may also attenuate any jitter of the input reference clock signal RefCK. The bandwidth of the PLL1 110 may be designed to reject most of jitter on the incoming input reference clock. As shown, the PLL1 110 may be powered by VCCA, which is a stable (or fixed) power supply source (such as a stable analog supply voltage or a filtered analog supply voltage).

The PLL2 120 may multiply the frequency of the output reference frequency signal ($f_{fixed}$) by a ratio M, determined from the divide-by-M circuit 125, to produce a desired nominal core clock signal ($f_{adaptive}$). The PLL2 120 may also act as a frequency modulator to modulate the nominal core clock frequency as a function of the noise amplitude of the core supply (VCCD). The PLL2 120 may be powered by two sources, namely both a filtered analog power supply VCCA and a "noisy" core power supply VCCD (or digital supply). VCCD may be filtered to pass noises within a certain frequency band. For example, a frequency not of interest may be filtered by the PLL2 120 itself or a low pass filter may be used to filter all the noises above the first droop frequencies. The PLL2 120 may generate a clock signal ($f_{adaptive}$) having a frequency that adjusts based on VCCD changes, thereby responding to first droop frequencies in a range of 50 MHz to 200 MHz, for example. For slower frequency droops such as second and third droop frequencies at 10 MHz and 100 kHz, for example, the bandwidth of the PLL2 120 may be designed to track the changes to maintain the target frequencies. The PLL2 120 may provide final frequency multiplication to produce nominal core frequency. The PLL2 120 may also modulate the core frequency around a nominal value based on core supply noise amplitude. The PLL2 120 may have a high sampling rate to control the phase error accumulation and reduce the sampling update jitter by small correction very frequently.

The clocking system 100 may operate such that as VCCD decreases the frequency ($f_{adaptive}$) of the core clock signal output from PLL2 120 also decreases. Likewise, as VCCD increases, the frequency ($f_{adaptive}$) of the core clock signal output from PLL2 120 also increases.

A multiplexer 130 may output one of two possible clock frequencies, for example, based on the MUXSEL select signal. Other clock frequencies (not shown) may also be selected by use of the multiplexer 130 or other type of selecting device. In the FIG. 2 embodiment, the multiplexer 130 may output either the adaptive frequency clock signal ($f_{adaptive}$) from the PLL2 120 or the fixed frequency clock signal ($f_{fixed}$) from the PLL1 110. In outputting the fixed frequency signal ($f_{fixed}$), the PLL2 120 may thereby be bypassed for certain tests and other configurations and applications of the system. That is, the fixed frequency signal may be used when the adaptive system is disabled.

As one example, for a reference clock frequency of 200 MHz and a ratio N set to 4, the PLL1 110 may generate an 800 MHz fixed oscillating frequency clock signal. With the M ratio set to 4, the nominal output frequency of the PLL2 120 may be 3.2 GHz. As another example, for a reference clock frequency of 200 MHz and a ratio N set to 2, the PLL1 110 may generate a 400 MHz fixed oscillating frequency clock signal. With the M ratio set to 8, the nominal output frequency of the PLL2 120 may be 3.2 GHz. However, since the PLL2 120 is powered by both the VCCD and VCCA, when the first droop occurs (such as around 50–200 MHz, for example), the PLL2 120 may adjust the output frequency and thereby closely track the voltage (of VCCD).

The bandwidth of the PLL2 120 may be larger than the bandwidth of the PLL1 110 so that the PLL2 120 may track all the bandwidth of the PLL1 110. That is, a larger bandwidth of the PLL2 120 may be needed to respond to different frequency bands.

Figure 3:
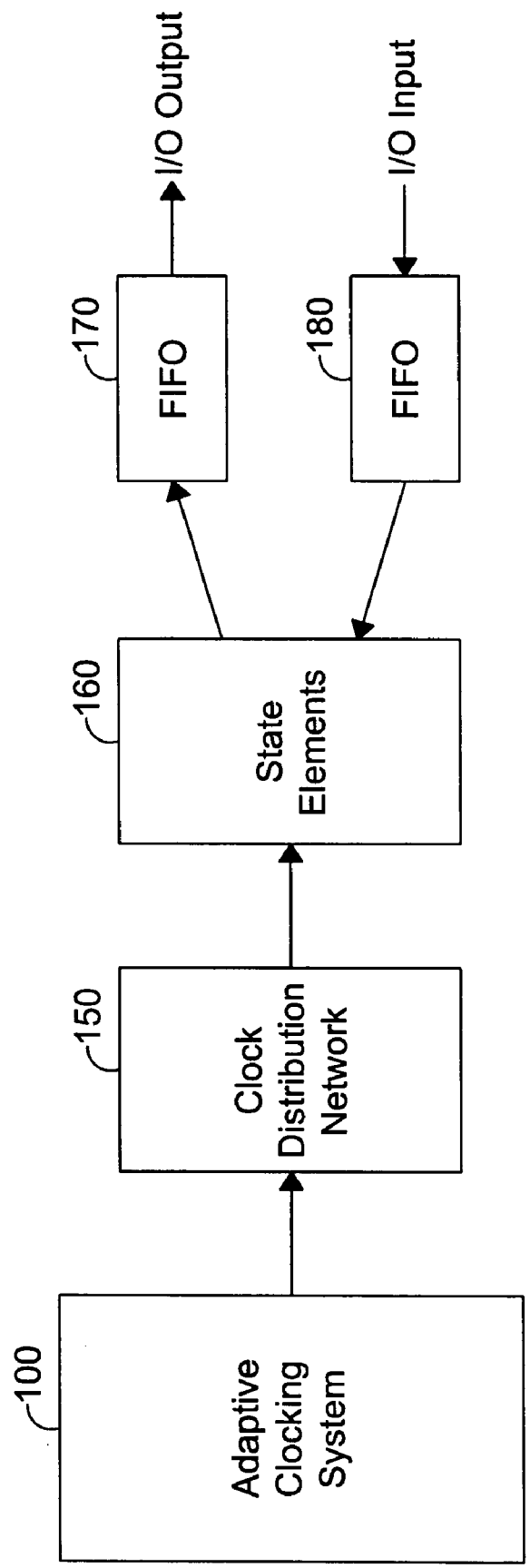
FIG. 3 is a block diagram of an adaptive clocking system according to an example embodiment of the present invention.

FIG. 3 is a block diagram of an adaptive clocking system according to an example embodiment of the present invention. Other embodiments and configurations are also within the scope of the present invention. More specifically, FIG. 3 shows the adaptive clocking system 100 (such as shown in FIG. 2) coupled to a clock distribution network 150. For example, the output of the multiplexer 130 (FIG. 2) may be coupled to the clock distribution network 150 to distribute the appropriate clock signal selected by the multiplexer. The clock distribution network 150 may be coupled to various state elements (or state machines) 160. The state elements 160 may be provided on a microchip or integrated circuit, for example. The state elements 160 may also be coupled to an output FIFO buffer 170 and an input FIFO buffer 180. The FIFO buffers 170, 180 may interface the variable core frequency clock signal with external I/O (not shown) that operate at fixed frequencies. In other words, the FIFO buffers 170, 180 may interface data from the core to the 10 domain. A depth of each of the FIFO buffers 170, 180 may be determined by a maximum phase error that accumulates while the adaptive PLL (such as the PLL2 120 in FIG. 2) is reacting to voltage droops. The depth of the FIFO buffers 170, 180 may be made to maintain synchronicity and determinism at the I/O. The adaptive PLL (such as PLL2 120 in FIG. 2) may ensure that the phase error returns to zero. That is, the depth of the FIFOs 170, 180 may be based on phase error. Phase error accumulation is also a function of the adaptive PLL (i.e., PLL2 120 in FIG. 2) designed target sensitivity to VCCD. The adaptive PLL sensitivity may be designed to match the voltage sensitivity of certain data speed critical paths for maximum tracking and thereby achieving optimum timing. However, there may be a cost (i.e., latency) associated with putting the FIFOs 170, 180 in the data path. As such, a limit may be provided on the number of cycles within the FIFOs to make sure the sensitivity is not exceeded.

Figure 4:
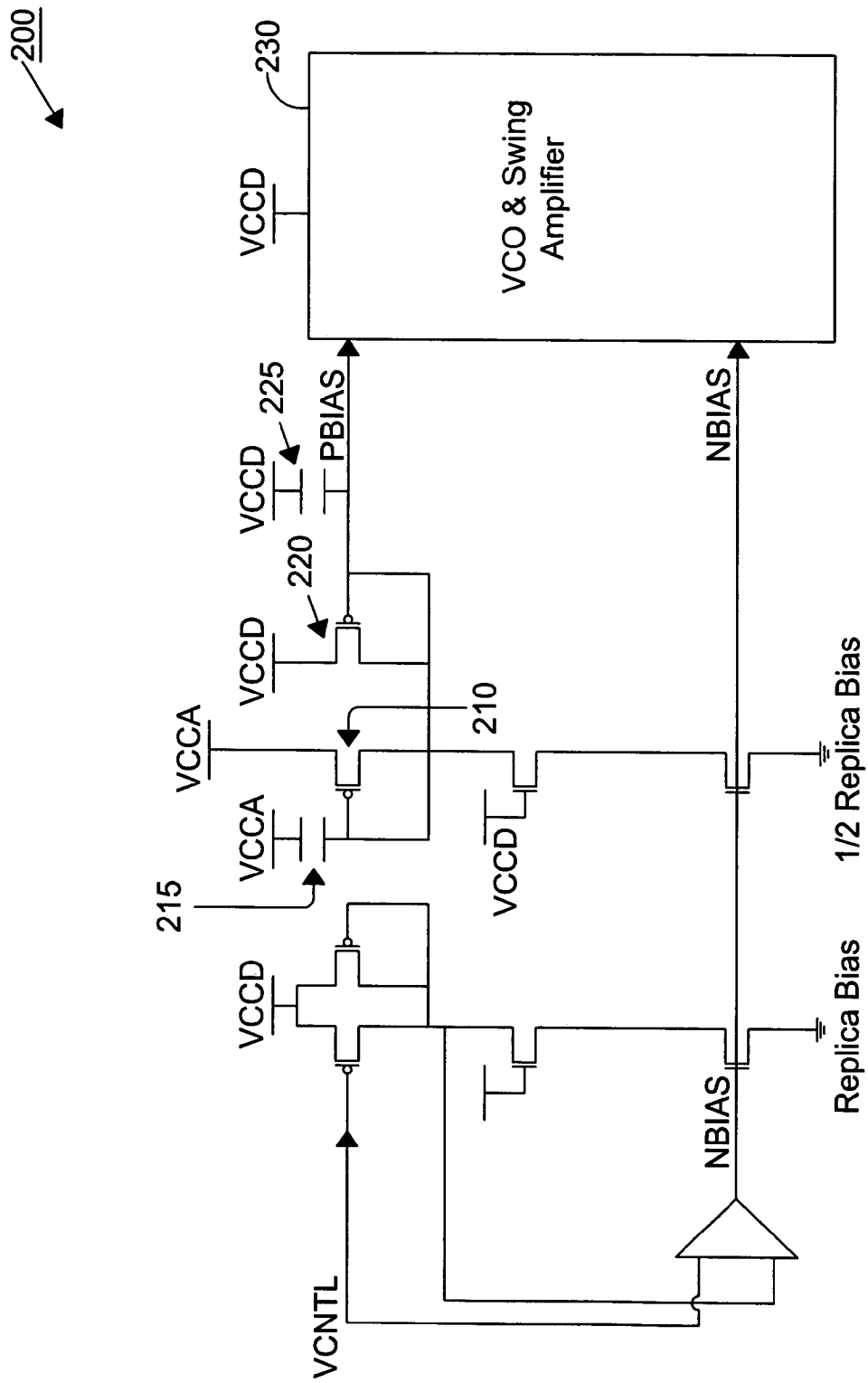
FIG. 4 shows an adaptive phase-locked loop system according to an example embodiment of the present invention.

FIG. 4 shows an adaptive phase-locked loop system 200 according to an example embodiment of the present invention. Other embodiments and configurations are also within the scope of the present invention. More specifically, FIG. 4 shows a replica bias circuit, a ½ replica bias circuit and a VCO circuit for an adaptive PLL (such as the PLL2 120 shown in FIG. 2). For ease of illustration, remaining portions (such as the phase detector, charge pumps, feedback dividers, loop filter capacitance) are not shown in FIG. 4. These remaining portions may be coupled to the fixed analog power supply voltage VCCA.

The replica bias circuit may be powered by the fixed power supply voltage VCCA such that signals VCNTL and nbias signal NBIAS are held steady (or fixed) during a droop event. Thus, these signals do not immediately react to the droop (although they may react to the phase error).

Components within the ½ replica bias circuit may include two PMOS transistors 210 and 220 each coupled to receive a different power supply voltage and two capacitors 215 and 225 each coupled to a different power supply voltage. For example, the PMOS transistor 210 may be coupled to the power supply voltage VCCA, whereas the PMOS transistor 220 may be coupled to the power supply voltage VCCD. Additionally, the capacitor 215 may be coupled to the power supply VCCA, whereas the capacitor 225 may be coupled to the power supply VCCD. A VCO and swing amplifier circuit 230 (hereafter the VCO 230) may also be coupled to the power supply voltage VCCD.

The sensitivity to droop and the magnitude of frequency change/droop voltage may be controlled based on a ratio of a size of the PMOS transistor 220 to a size of the PMOS transistor 210. The sensitivity to droop and the magnitude of frequency charge/droop voltage may also be controlled based on a ratio of a size of the capacitor 225 to a size of the capacitor 215. For example, a maximum sensitivity may be achieved when the entire ½ replica bias circuit is coupled to the fixed power supply voltage VCCA. In this example, both the NBIAS and PBIAS signals applied to the VCO 230 are both held unchanged. However, since VCCD varies in droop events (or as a result of droop events), the output frequency of the VCO 230 may track VCCD. As such, the PBIAS levels place a limit on the lower frequency/droop magnitude. Further to extend the slower frequency range, additional devices may be provided to operate the VCO 230 at stronger bias levels. In order to lower and manage the sensitivity to voltage droops, components of the ½ replica bias circuit may be split such that one side (or portion) is coupled to VCCD and the other side (or other portion) is coupled to VCCA. This controls not only the sensitivity but also extends the lower frequency operation without adding additional devices.

Figure 5:
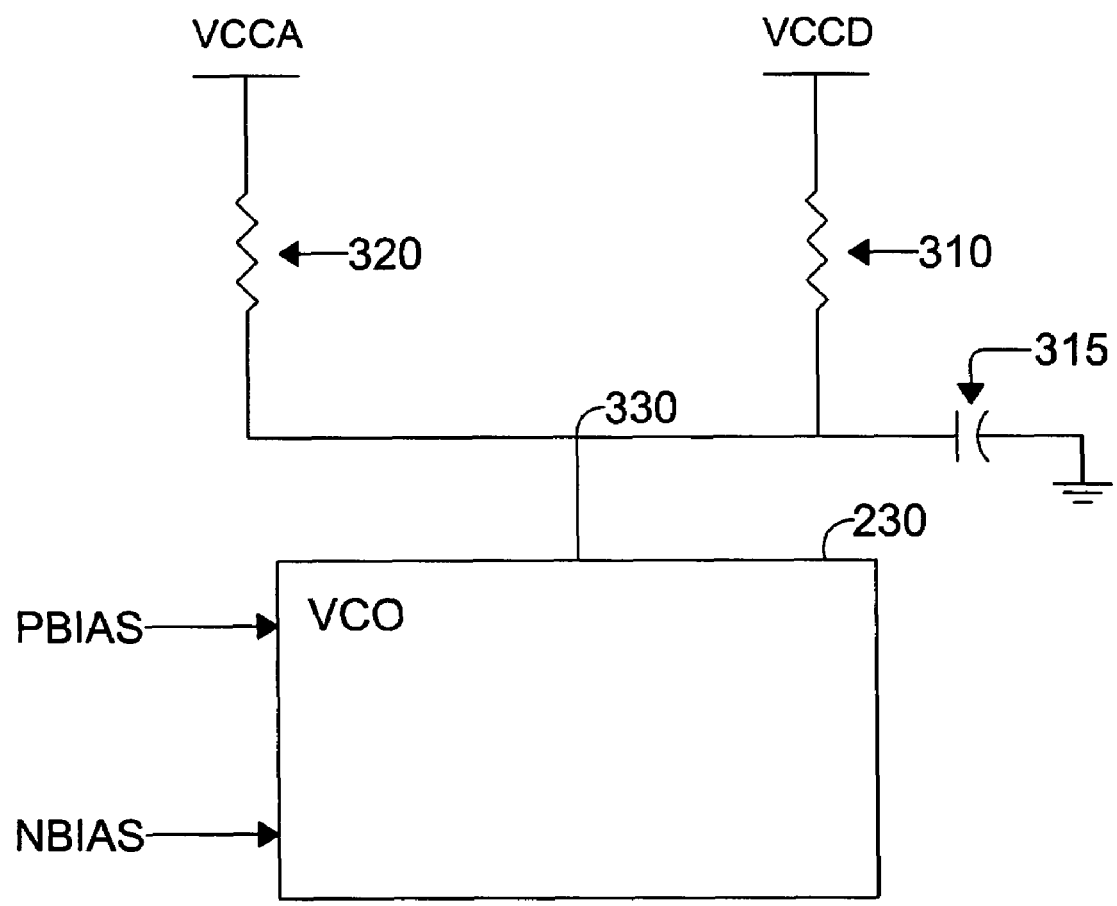
FIG. 5 shows a mechanism to adjust sensitivity according to an example embodiment of the present invention.

FIG. 5 shows another mechanism to adjust sensitivity according to an example embodiment of the present invention. Other embodiments and configurations are also within the scope of the present invention. The mechanism shown in FIG. 5 may be used with or without any of the mechanisms discussed above to adjust sensitivity to droop and a magnitude of frequency change/droop voltage. More specifically, FIG. 5 shows an effective resistance 310 coupled to the power supply VCCD and an effective resistance 320 coupled to the power supply VCCA. A decoupling capacitor 315 is also provided between the effective resistance 310 and GROUND. Both of the effective resistances 310 and 320 may be formed by including a plurality of PMOS transistors, for example, that may be enabled or disabled based on a desired effective resistance. Adjustment of the effective resistances 310 and 320 controls the sensitivity to droop.

The drains of each of the transistors forming the effective resistances 310 and 320 may be coupled to a node 330, which in turn is coupled to a signal line to power the VCO 230. Sensitivity of the VCO 230 (to voltage droop) may be accomplished by adjusting a size of the effective resistance 310 relative to a size of the effective resistance 320. Stated differently, the sensitivity may be adjusted based on a percentage of power from the VCCD power supply as compared to/from the VCCA power supply.

While FIG. 5 shows one mechanism to adjust the sensitivity, other mechanisms described above may also be used either with the mechanism of FIG. 5 or without the mechanism of FIG. 5. Embodiments of the present invention are applicable to one or more of the above described mechanisms to adjust sensitivity.

Figure 6:
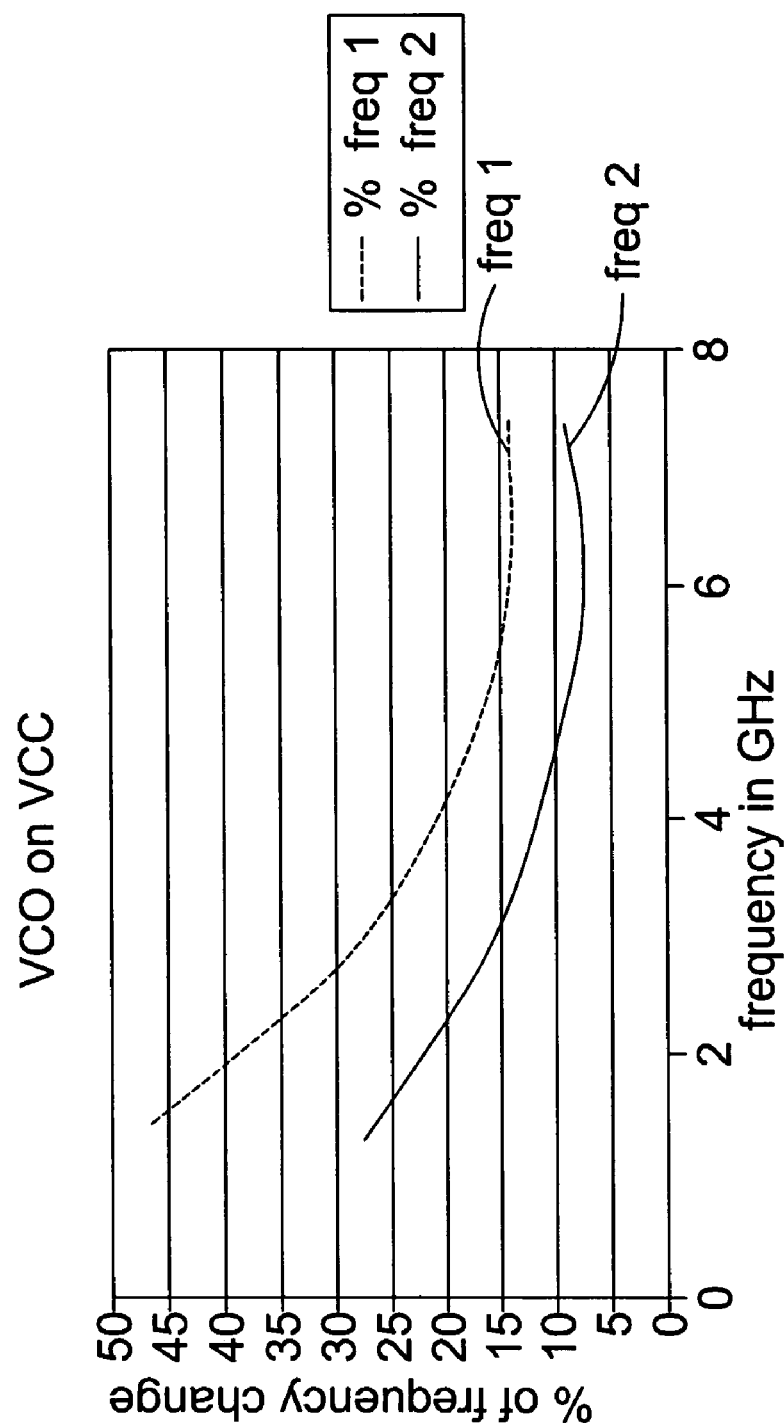
FIG. 6 is a graph showing sensitivity according to example embodiments of the present invention.

FIG. 6 is a graph showing sensitivity based on voltages applied to an adaptive clocking apparatus according to example embodiments of the present invention. Other embodiments and graphs are also within the scope of the present invention. More specifically, FIG. 6 shows the sensitivity to 100 mV 100 MHz resonant droop voltage, for two examples. In a first example (labeled freq1), the entire ½ replica bias circuit (of FIG. 4, for example) is coupled to VCCA while the VCO 230 is coupled to VCCD. In the second example (labeled freq2), half the VCR in the ½ replica bias circuit is coupled to VCCA and the other half of the VCR in the ½ replica bias circuit is coupled to VCCD. As shown, the first example (freq1) has higher sensitivity than the second example (freq2). That is, the VCO sensitivity may be controlled by varying the ratio of replica bias components connected to VCCD and VCCA.

Figure 7:
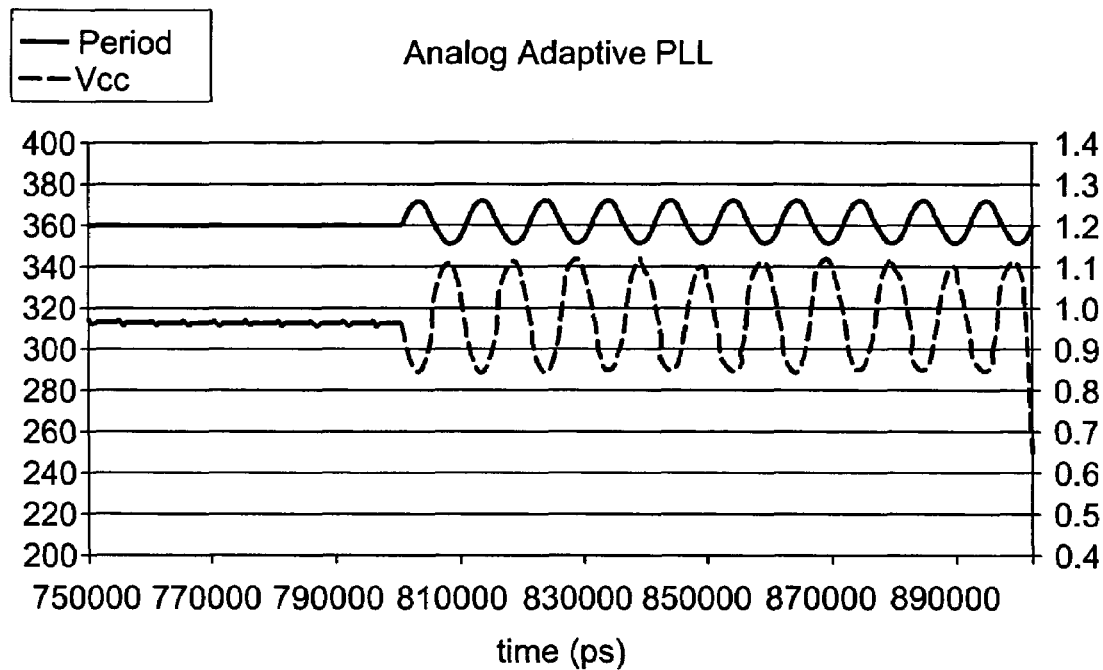
FIG. 7 shows graphs of an analog adaptive PLL and phase error.
Figure 7:
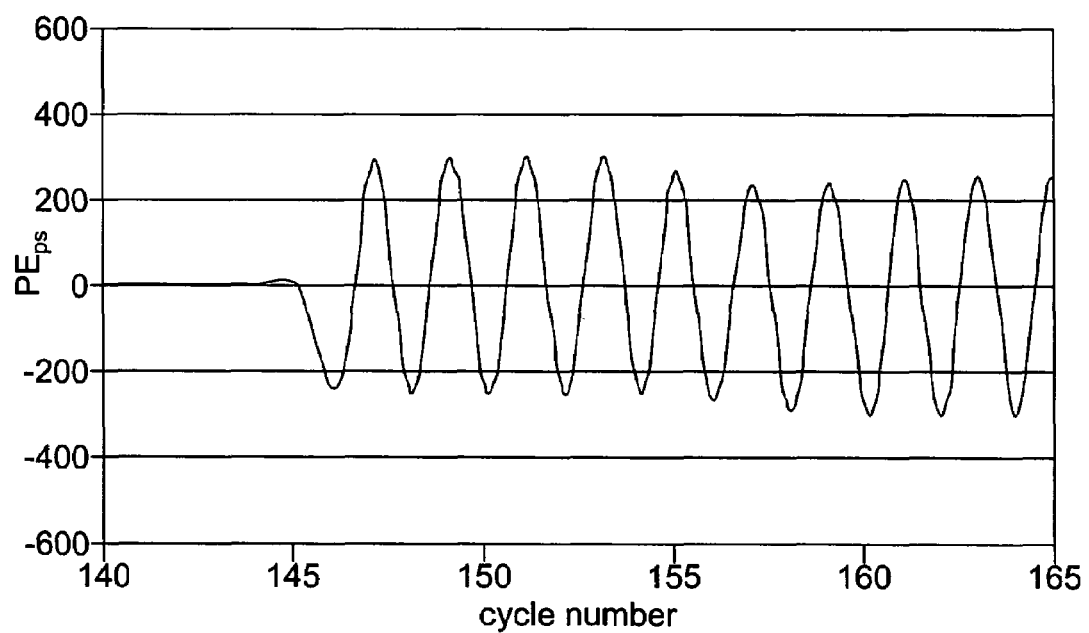

FIG. 7 shows graphs of an analog adaptive PLL and phase error. That is, these graphs show a PLL full loop simulation with a resonant 100 mV/100 MHz voltage droop applied on VCCD after the PLL has locked. As may be seen, the PLL output frequency as well as the phase error accumulation clears following the noise on VCCD. Other graphs and data are also within the scope of the present invention.

Figure 8:
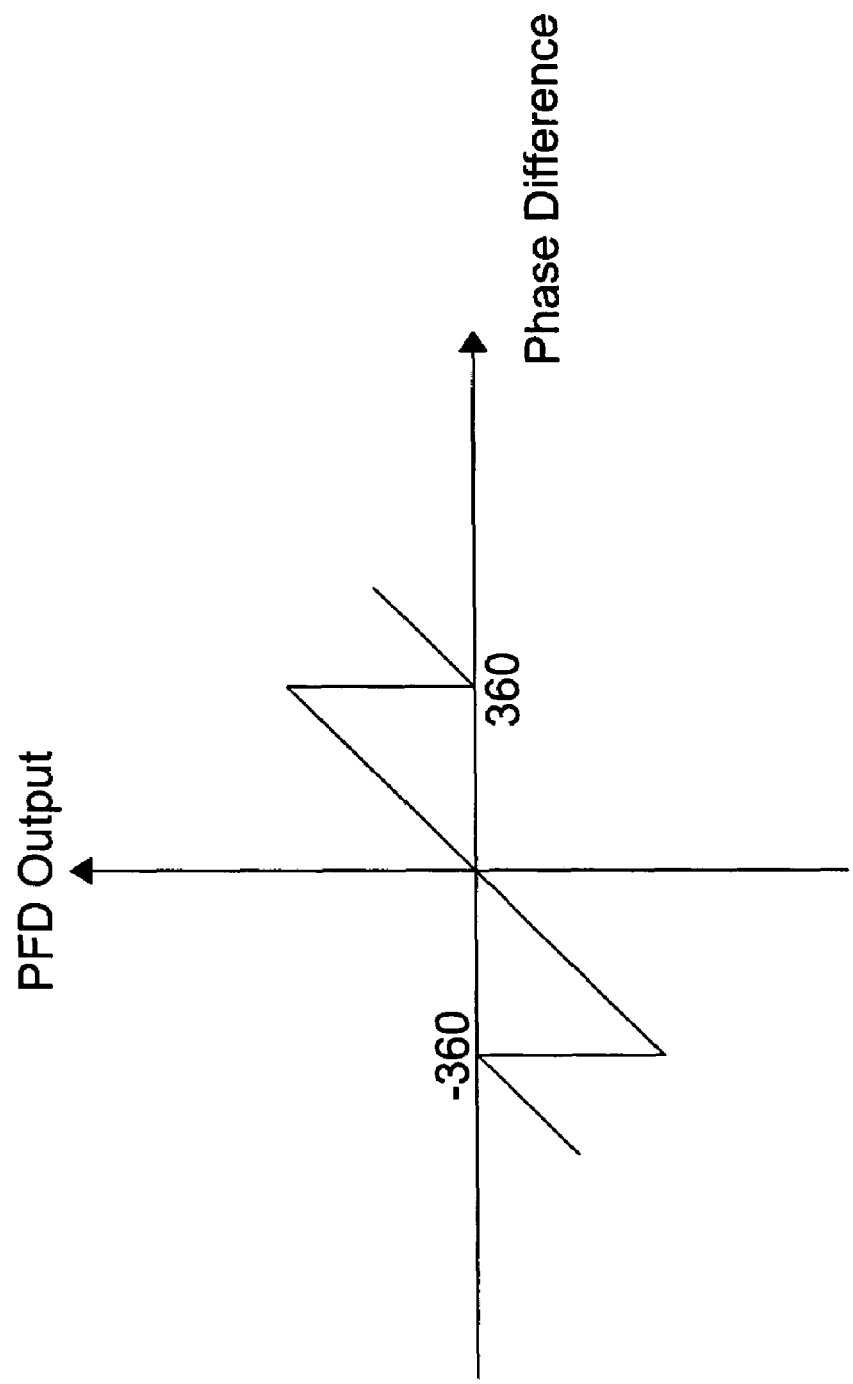
FIG. 8 is a graph showing phase difference versus a phase frequency detector output.

One aspect of the adaptive PLL is the tradeoffs between the sampling frequency and bandwidth with phase error accumulation and determinism. FIG. 8 is a graph showing phase difference versus a phase frequency detector output. More specifically, FIG. 8 shows that the phase frequency detector has discontinuity if phase error exceeds +/−2π. As such, the phase error accumulation should not exceed +/−360 degree (or a full sampling cycle). If the phase error exceeds +/−2π, the PLL may loose lock (i.e., cycle slipping occurs) and determinism may be lost. In an operation where the phase error (PE) <+/−2π, determinism may be preserved as the PLL maintains the same number of edges while attempting to correct for any phase error accumulation or residual. The lower the sampling frequency, the larger the phase error in absolute time allowed within the 2π range. Thus, it is desired to have a sampling frequency that is relatively low. However, on the other hand it may be desired to correct quickly and smoothly track VCCD so the PLL bandwidth may need to be high. For example, to track 2nd droops that may have frequency contents on the order of 1–10 MHz (or may exceed 10 MHZ), the PLL bandwidth may be higher than 10 MHz to be able to track 2nd droop phase errors accumulation. For at least these reasons, a reasonable divide ratio (M) may be selected that enables the enough phase error accumulation while still allowing high PLL bandwidth. In at least one embodiment, the ratio of m may be 2–8 so as to enable enough phase error and high enough PLL bandwidth. Since the PLL may maintain the same frequency for slow droops, no large phase error may accumulate and as a result the FIFO, which interfaces with the I/O such as shown in FIG. 2, remains within reasonable depth set based on the maximum 1st droop frequency change.

Figure 9:
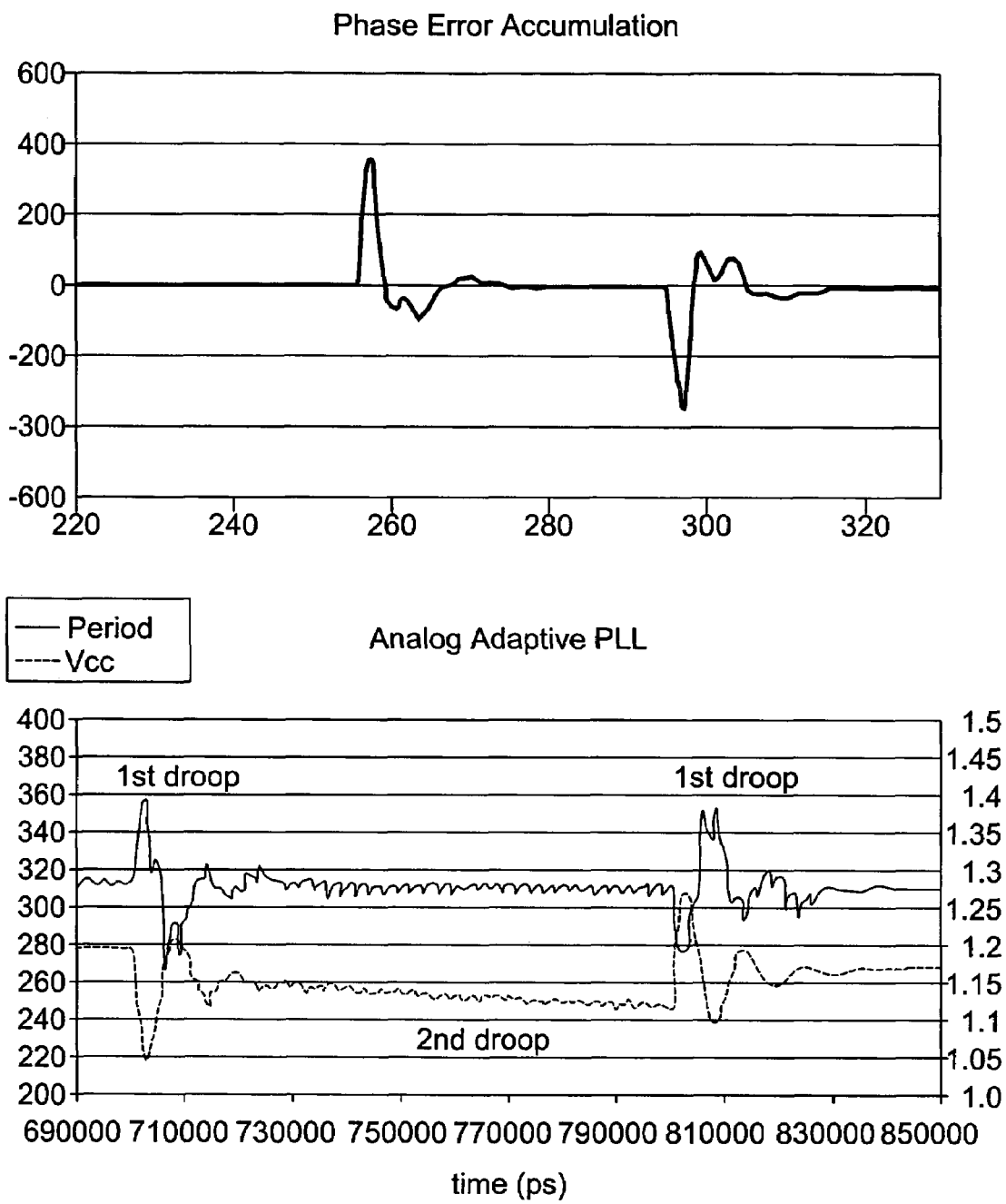
FIG. 9 are graphs showing phase error accumulation and analog adaptive PLL according to example simulations.

FIG. 9 are graphs showing phase error accumulation and analog adaptive PLL according to example simulations. More specifically, FIG. 9 shows VCCD droops in 3 examples, namely a 1st droop (on-current), a second droop, and a 1st droop (off-current). In these example simulations, a divide-by-8 circuit was used with 400 MHz input clock (n=2 based on 200 MHz reference clock). As shown, during the first 1st droop, the PLL tracks the voltage and corrects any phase error residual. In the 2nd droop example, the PLL attempts to hold the frequency unchanged. And during the second 1st droop, the PLL also adjusts the frequency to track the voltage. Other graphs and data are also within the scope of the present invention.

Figure 10:
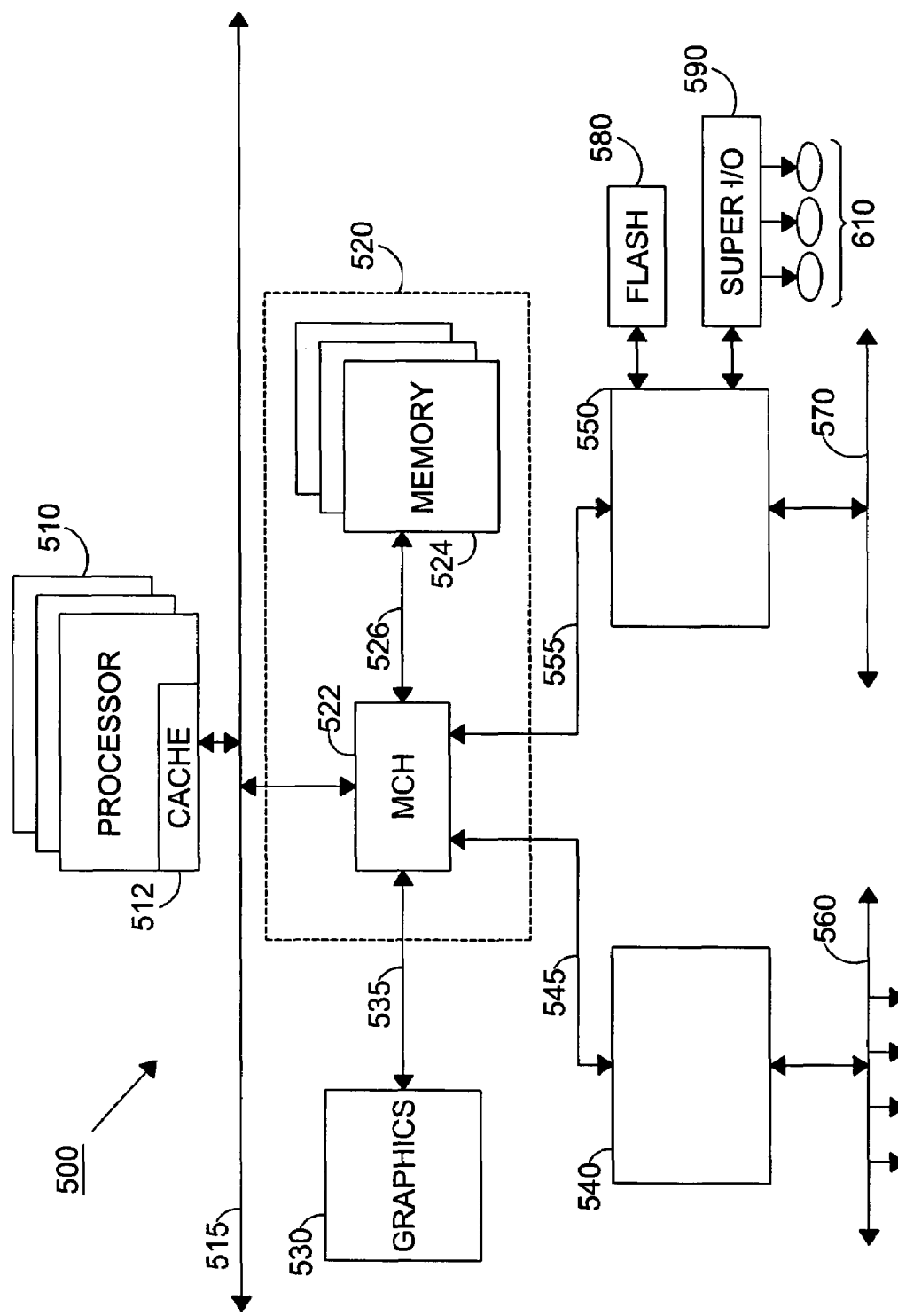
FIG. 10 is a block diagram of a computer system according to an example embodiment of the present invention.

FIG. 10 is a block diagram of an example computer system that may include embodiments of the present invention as described above. Other computer system platforms or other types of platforms are also within the scope of the present invention. As shown in FIG. 10, the computer system 500 may include a processor subsystem 510, a memory subsystem 520 coupled to the processor subsystem 510 by a front side bus 515, graphics 530 coupled to the memory subsystem 520 by a graphics bus 535, one or more host chipsets (labeled 540–550) coupled to the memory subsystem 520 by hub links 545 and 555 for providing an interface with peripheral buses such as Peripheral Component Interconnect (PCI) buses 560 and 570 of different bandwidths and operating speeds, a flash memory 580, and a super I/O 590 coupled to the chipset 550 by a low pin count (LPC) bus for providing an interface with a plurality of I/O devices 610 such as a keyboard controller for controlling operations of an alphanumeric keyboard, a cursor control device such as a mouse, track ball, touch pad, joystick, etc., a mass storage device such as magnetic tapes, hard disk drives (HDD), and floppy disk drives (FDD), and serial and parallel ports to printers, scanners, and display devices. A plurality of I/O devices 620 may be provided along the PCI bus 560. The computer system 500 may be configured differently or employ some or different components than those shown in FIG. 10.

The processor subsystem 510 may include a plurality of host processors and a cache subsystem 512. The memory subsystem 520 may include a memory controller hub (MCH) 522 coupled to the host processors by the front side bus 515 (i.e., host or processor bus) and at least one memory element 524 coupled to the MCH 522 by a memory bus 526. The memory element 524 may be a dynamic random-access-memory (DRAM), or may be a read-only-memory (ROM), video random-access-memory (VRAM) and the like. The memory element 524 stores information and instructions for use by the host processors. The graphics 520 may be coupled to the main controller hub 522 of the memory subsystem 520 by graphics bus 535, and may include, for example, a graphics controller, a local memory and a display device (e.g., cathode ray tube, liquid crystal display, flat panel display, etc.). An adaptive frequency clock generation system as described above, may be provided within the computer system 500 such as within one of the integrated circuits or microchips provided in the system 500, for example.

Embodiments of the present invention may be provided within various electronic systems. Examples of represented systems may include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Embodiments of the present invention may have advantages over other digital methods. For example, there may be a reduced circuitry. A reduced reaction time to droop may occur since the droop detector is built into the VCO. Additionally, no lost benefit may occur due to discrete step sizes. The system also does not require second and third droops to be eliminated for the system to work. Further, embodiments may provide adaptive frequency with voltage compatible with synchronous clocking systems thus preventing over voltage design and allowing significant power reduction while retaining determinism. Further, the scheme may be fully analog and does not require any droop detection or additional latency as the PLL instantly and directly responds to the droops and thus provides the maximum timing benefit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A clock generating apparatus comprising:
   a first phase lock loop device to be powered by a first power supply voltage; and
   a second phase lock loop device, coupled to the first phase lock loop device, the second phase lock loop device including a bias circuit to be powered by the first power supply voltage and a second power supply voltage and the second phase lock loop device including a voltage controlled oscillator (VCO) to be powered by the second power supply voltage, the bias circuit to provide a bias voltage to the voltage controlled oscillator, the bias voltage being different than the first power supply voltage and the second power supply voltage, the second phase lock loop device to output a clock signal having an adaptive frequency based on the second power supply voltage.

2. The clock generating apparatus of claim 1, wherein the first power supply voltage comprises an analog voltage and the second power supply voltage comprises a digital voltage.

3. The clock generating apparatus of claim 1, wherein fluctuations of the frequency of the clock signal output from the second phase lock loop device are based on fluctuations of the second power supply voltage.

4. The clock generating apparatus of claim 1, wherein the first phase lock loop device outputs a clock signal having a fixed frequency, the clock signal having the fixed frequency being input to the second phase lock loop device.

5. The clock generating apparatus of claim 1, wherein the second phase lock loop device includes components powered by the first power supply voltage and components powered by the second power supply voltage.

6. The clock generating apparatus of claim 1, wherein a sensitivity to droop is based on a coupling percentage of the second power supply voltage to power the VCO.

7. The clock generating apparatus of claim 1, wherein a sensitivity to voltage droop is determined based on a ratio of capacitor sizes within the second phase lock loop device.

8. The clock generating apparatus of claim 1, wherein a sensitivity to voltage droop is determined based on a ratio of transistor sizes within the second phase lock loop device.

9. The clock generating apparatus of claim 1, wherein the apparatus corrects for phase error accumulation.

10. The clock generating apparatus of claim 1, further comprising buffers to couple core components, operating based on the clock signal, with external input/output (I/O).

11. A clocking system comprising:
    an adaptive phase lock loop device powered by an analog power supply voltage and a digital power supply voltage, the adaptive phase lock loop device including a bias circuit to be powered by the analog power supply voltage and the digital power supply voltage, and the adaptive phase lock loop device including a voltage controlled oscillator (VCO) to be powered by the digital power supply voltage, the bias circuit to provide a bias voltage to the voltage controlled oscillator, the bias voltage being different than the analog power supply voltage and the digital power supply voltage, the adaptive phase lock loop device to receive a first clock signal and to output a second clock signal having an adaptive frequency based on a voltage of the digital power supply voltage.

12. The clocking system of claim 11, further comprising a fixed phase lock loop device powered by the analog power supply voltage, the fixed phase lock loop device to receive a reference clock signal and to provide the first clock signal to the adaptive phase lock loop device.

13. The clocking system of claim 12, wherein fluctuations of the frequency of the second clock signal are based on fluctuations of the digital power supply voltage.

14. The clocking system of claim 12, wherein the fixed phase lock loop device outputs the first clock signal having a fixed frequency.

15. The clocking system of claim 11, wherein the adaptive phase lock loop device includes components powered by the analog power supply voltage and components powered by the digital power supply voltage.

16. The clocking system of claim 11, wherein a sensitivity to droop is based on a coupling percentage of the second power supply voltage to power the VCO.

17. The clocking system of claim 11, wherein a sensitivity to voltage droop is determined based on a ratio of capacitor sizes within the adaptive phase lock loop device.

18. The clocking system of claim 11, wherein a sensitivity to voltage droop is determined based on a ratio of transistor sizes within the adaptive phase lock loop device.

19. The clocking system of claim 11, further comprising buffers to couple core components with external input/output (I/0).

20. An electronic system comprising:
    an integrated circuit having a clock generating apparatus; and
    input/output (I/O) components coupled external to the integrated circuit, the clock generating apparatus comprising:
    a first phase lock loop device to be powered by a first power supply voltage; and
    a second phase lock loop device to be powered by the first power supply voltage and a second power supply voltage, the second phase lock loop device including a bias circuit to be powered by the first power supply voltage and the second power supply voltage, the second phase lock loop device also including a voltage controlled oscillator to be powered by the second power supply voltage, the bias circuit to provide a bias voltage to the voltage controlled oscillator, the bias voltage being different than the first power supply voltage and the second power supply voltage, the second phase lock loop device to output a clock signal having a frequency based on the second power supply voltage.

21. The electronic system of claim 20, wherein the first power supply voltage comprises an analog voltage and the second power supply voltage comprises a digital voltage.

22. The electronic system of claim 20, wherein fluctuations of the frequency of the clock signal output from the second phase lock loop device are based on fluctuations of the second power supply voltage.

23. The electronic system of claim 20, further comprising buffers to couple core components of the integrated circuit with the I/O components.

24. The electronic system of claim 20, wherein the first power supply and the second power supply are external to the integrated circuit.

25. The electronic system of claim 20, wherein the first power supply voltage is different than the second power supply voltage.

26. The electronic system of claim 20, wherein the first phase lock loop device includes another bias circuit and another voltage controlled oscillator, the another bias circuit to provide a bias voltage to the another voltage controlled oscillator, the bias voltage being different than the first and second power supply voltages.

27. The electronic system of claim 20, further comprising a multiplexer to select an output of the first phase lock loop device or to select the clock signal output from the second phase lock loop device.

28. The clock generating apparatus of claim 1, wherein the first power supply voltage is different than the second power supply voltage.

29. A clock generating apparatus comprising:
a first phase lock loop device to be powered by a first power supply voltage; and
a second phase lock loop device, coupled to the first phase lock loop device, to be powered by the first power supply voltage and a second power supply voltage, the second phase lock loop device to output a clock signal having an adaptive frequency based on the second power supply voltage; and
a multiplexer to select an output of the first phase lock loop device or to select the clock signal output from the second phase lock loop device.

30. The clock generating apparatus of claim 1, wherein the first phase lock loop device includes another bias circuit and another voltage controlled oscillator, the another bias circuit to provide a bias voltage to the another voltage controlled oscillator, the bias voltage being different than the first and second power supply voltages.

* * * * *